(12) United States Patent
Tong et al.

(10) Patent No.: US 12,206,395 B2
(45) Date of Patent: Jan. 21, 2025

(54) SIGNAL SWITCH WITH REDUCED PARASITIC CAPACITANCE

(71) Applicant: pSemi Corporation, San Diego, CA (US)

(72) Inventors: Yucheng Tong, San Diego, CA (US); Parvez H. Daruwalla, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/403,250

(22) Filed: Aug. 16, 2021

(65) Prior Publication Data

US 2023/0060745 A1 Mar. 2, 2023

(51) Int. Cl.
*H03K 17/16* (2006.01)
(52) U.S. Cl.
CPC .................... *H03K 17/161* (2013.01)
(58) Field of Classification Search
CPC .................................................. H03K 17/161
See application file for complete search history.

(56) References Cited

U.S. PATENT DOCUMENTS

| | | | |
|---|---|---|---|
| 5,903,178 A * | 5/1999 | Miyatsuji | H03K 17/693 333/81 R |
| 7,199,635 B2 * | 4/2007 | Nakatsuka | H03K 17/102 327/308 |
| 10,200,027 B1 * | 2/2019 | Kim | H03K 17/161 |
| 10,431,540 B1 * | 10/2019 | Cheng | H01L 23/5223 |
| 10,530,320 B2 * | 1/2020 | Sharma | H03H 11/04 |
| 2005/0231439 A1 | 10/2005 | Atsushi et al. | |
| 2005/0270119 A1 * | 12/2005 | Fukumoto | H03K 17/693 333/104 |
| 2006/0252394 A1 | 11/2006 | Atsushi et al. | |
| 2019/0044508 A1 | 2/2019 | Shapiro et al. | |
| 2021/0210847 A1 * | 7/2021 | Su | H01Q 1/48 |

FOREIGN PATENT DOCUMENTS

KR    10-2009-0104157    10/2009

OTHER PUBLICATIONS

Korean Intellectual Property Office, International Search Report and Written Opinion received from KIPO dated Nov. 29, 23 for appln. No. PCT/US2022/039831, 10 pgs.

* cited by examiner

*Primary Examiner* — Ryan Johnson
*Assistant Examiner* — Colleen J O Toole
(74) *Attorney, Agent, or Firm* — Steinfl + Bruno LLP

(57) ABSTRACT

Multi-way signal switch designs and methods for reducing parasitic capacitance. In a first embodiment, two or more series-coupled FET shunt-switches are coupled to at least one switch cell through-switch. At least one shunt-switch is set to an OFF state during normal operation so as to function as a capacitor, while at least one other shunt-switch is set to behave like a capacitor in a switch cell ON state, and is set to behave like a resistor in a switch cell OFF state. In a second embodiment, the combination of at least one FET shunt-switch coupled in series with a capacitor functions as a shunt connection for the signal path, wherein the FET shunt-switch is set to behave like a capacitor when the switch cell is in an ON state, and is set to behave like a resistor when the switch cell is in an OFF state.

9 Claims, 12 Drawing Sheets

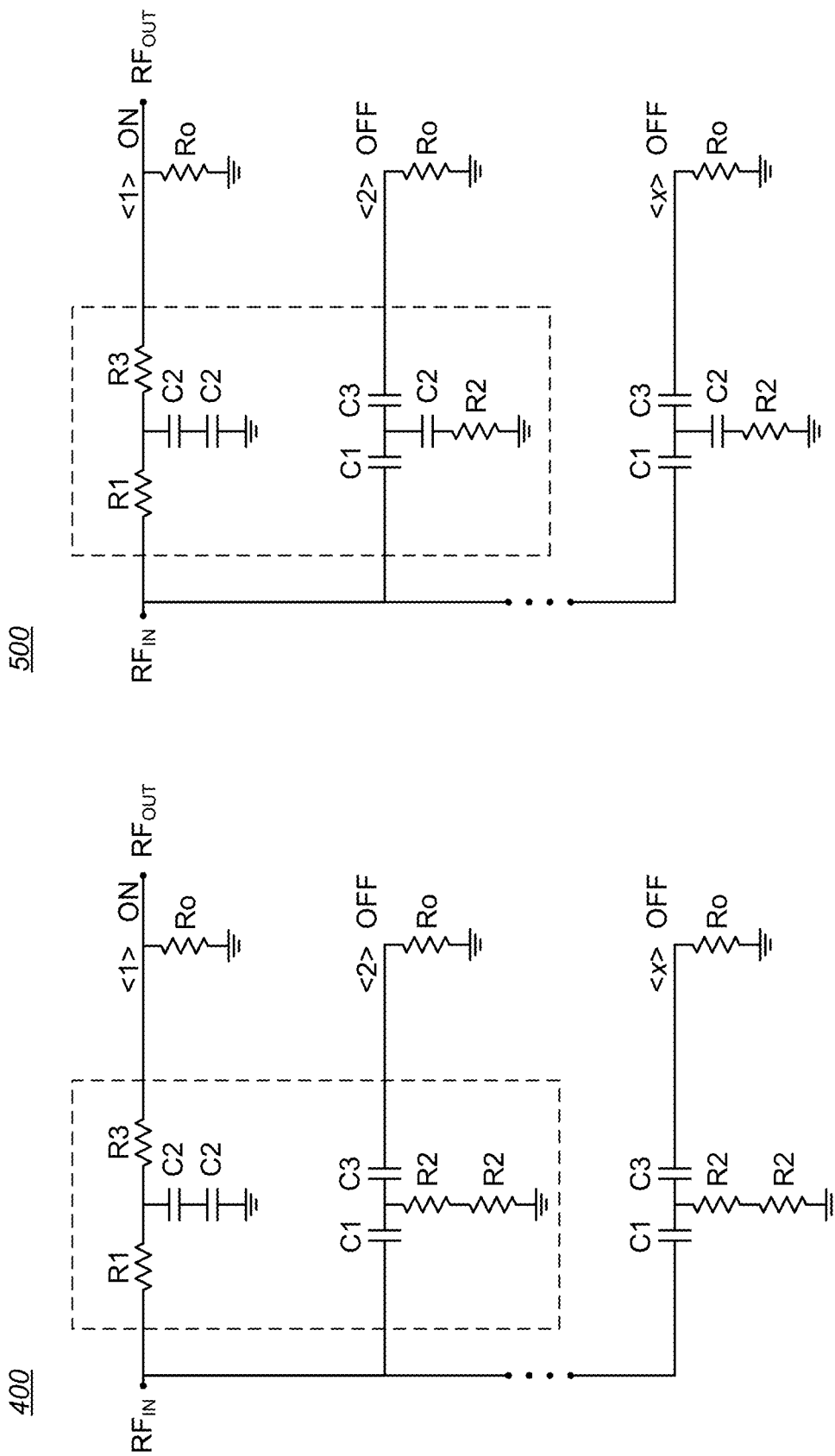

SIGNAL SWITCH WITH REDUCED PARASITIC CAPACITANCE

BACKGROUND

(1) Technical Field

This invention generally relates to electronic devices, and more specifically to electronic signal switching devices.

(2) Background

Electronic signal switches are used in a wide variety of applications. One type of signal switch in common use is a field effect transistor (FET) that is actively controlled through a gate terminal to block or pass an electrical signal connected in series with source and drain terminals of the FET.

FET switches may be fabricated in various technologies (e.g., standard bulk silicon, silicon-on-insulator, silicon-on-sapphire, GaN HEMT, GaAs pHEMT, and MESFET processes) and are commonly represented in schematic diagrams as an idealized ON-OFF switch device. However, in many applications, particularly in radio frequency (RF) circuits, the structure and materials of a FET switch may have significant effects on its own operation (e.g., with respect to bandwidth, isolation, power handling, and response time) and the presence of a FET switch may have significant effects on other components in a circuit (for example, by imposing a capacitive load). Such effects arise in part because a "CLOSED" or "ON" (i.e., low impedance or conductive) FET has a non-zero resistance $R_{ON}$, and an "OPEN" or "OFF" (i.e., high impedance or blocking) FET behaves as a capacitor (having a capacitance of $C_{OFF}$) due to parasitic capacitances arising from the proximity of various semiconductor structures, particularly within the close confines of an integrated circuit (IC). Large signal behaviors affecting power handling may also arise from other characteristics of a FET, such as avalanche breakdown, current leakage, accumulated charges, etc. Moreover, in a multiple-way FET-based RF switch IC, added impedance elements (e.g., inductors and/or transmission lines) as well as parasitic inductances and capacitances caused by interconnections between FETs and by other circuit structures complicate the design of such an IC. Accordingly, the actual in-circuit behavior of a FET must be taken into account when designing FET based circuitry.

A multiple-way (e.g., single pole, multiple-throw, or multiple-pole, single-throw, or multiple-pole, multiple-throw) FET-based radio frequency (RF) switch architecture has been found useful in applications which require multiple transmit and/or receive paths for RF signals. For example, such a switch architecture is useful in wireless radio systems for coupling one or more antennas to one or more sets of transmit/receive circuitry. Other examples of applications that can benefit from a multiple-way FET-based switch architecture include cellular telephones, personal computers, tablet computers, wireless network components, televisions, cable system "set top" boxes, radar systems, automatic test equipment, and electronics laboratory bench measurement equipment.

FIG. 1 is a block diagram of a prior art receiver-side front end of an RF transceiver 100. A first branch 101 of the RF transceiver 100 includes an RF source 102 (e.g., an antenna or coaxial cable) coupled to one or more frequency filters 104. A switch 106 coupled to the frequency filters 104 selects a particular filter (or a bypass path) to output to an amplifier 108, which typically is a low noise amplifier ("LNA") responsible for providing a first stage of amplification for a received RF signal. In this example, the output of the amplifier 108 is coupled to a single-pole, multiple-throw (SPxT) switch 110; for example, if x=6, then the switch 110 would be an SP6T switch. In some embodiments, the amplifier 108 may have an internal bypass switch that allows an unamplified signal to propagate from the switch 106 to the SPxT switch 110. The x outputs of the SPxT switch 110 may be coupled to as many as x RF targets 112, such as down-conversion and baseband circuitry. Alternatively, the outputs of the SPxT switch 110 may terminate at contacts, such as solder bumps, in an IC embodiment of the RF transceiver 100 front end. In many applications, multiple amplifying branches are needed to cover all frequencies in one or more bands. The example in FIG. 1 shows 5 additional branches 114-118 of the RF transceiver 100 (reference numbers to the similar components of each branch are omitted to reduce clutter). Note that in some applications, the switches 106 may also be SPxT switches. In some applications, xPST and/or xPyT switches may be used for the switches 106 and/or 110.

With the example architecture shown in FIG. 1, up to x RF sources 102 may be coupled to a corresponding RF target 112 by selecting one signal path in a selected SPxT switch 110 to be ON while all other signal paths in the same selected SPxT switch 110 are OFF. In some applications, such as Carrier Aggregation configurations, multiple paths within one SPxT switch may be enabled at the same time. In some cases, for an SPxT architecture, all 'x' paths may be ON at the same time. Further, since all of the SPxT switches 110 are commonly controlled, any RF source 102 may be coupled to any RF target 112, and accordingly the set of switches 110 may be regarded as a single multi-way xPyT switch 114.

As noted above, a typical front end of an RF transceiver 100 utilizes LNAs for the amplifier 108. The operational characteristics of an LNA are very important to the overall quality of an RF receiver, particularly low noise, gain flatness (i.e., signal gain variation across frequency), linearity, input matching, and output matching. However, one or more of those operational characteristics can be degraded by parasitic capacitance coupled to the LNA output, and such parasitic capacitance includes the SPxT switch 110.

FIG. 2 is a diagram of a prior art SP6T switch shown in symbolic form 200, as a schematic diagram 202, and as a corresponding equivalent circuit 204 when one signal path is selected to be ON and all other signal paths are set to OFF. In the schematic diagram 202, each of 6 signal paths <1> . . . <6> includes a switch cell 206-1 . . . 206-6 each comprising a first FET through-switch T1 series coupled to a second FET through-switch T2. A FET shunt-switch S is coupled from a node between through-switches T1 and T2 to a reference potential, such as circuit ground.

In the equivalent circuit 204, signal path <1> is set to an ON state, allowing signals to propagate from $RF_{IN}$ along the pathway indicated by dotted line 208. All other signal paths <2> . . . <6> are set to an OFF state. For a signal path in the ON state, FET through-switches T1 and T2 are ON and behave like equivalent resistors $R_{T1}$ and $R_{T2}$, while the FET shunt-switch S is OFF and behaves like an equivalent capacitor $C_S$. Conversely, for a signal path in the OFF state, FET through-switches T1 and T2 are OFF and behave like equivalent capacitors $C_{T1}$ and $C_{T2}$, while the FET shunt-switch S is set to ON and behaves like an equivalent resistor $R_S$.

As the equivalent circuit 204 shows, the 5 signal paths <2>...<6> set to an OFF state present a significant amount of equivalent capacitance at the $RF_{IN}$ port of the SP6T switch 200, which adversely affects an LNA or other circuit coupled to the $RF_{IN}$ port (e.g., the amplifier 108 of FIG. 1). To reduce that parasitic capacitance, the FET switches in the schematic diagram 202 could be made physically smaller to reduce their respective $C_{OFF}$ values. However, smaller FETs exhibit higher loss when ON (which is undesirable) and are more susceptible to electrostatic discharged (ESD) events and thus may not meet desired ESD specifications. If the FETs are made large enough to satisfy desired loss/ESD specifications, resulting degradation of LNA performance may not meet LNA and/or SPxT signal switch performance specifications for the coupled circuit (e.g., an LNA).

Even if a particular SPxT switch—such as an SP6T switch—meets current performance and ESD specifications, higher order SPxT switches—such as an SP8T switch—may add a sufficiently large parasitic capacitance that such specifications cannot be met. It would then be necessary to add extra external/internal tuning components to deal with the larger parasitic capacitance from the SPxT switch, which increases module cost. Such additional external/internal tuning components also limit the LNA bandwidth, which degrades the performance of the coupled circuit, especially for a wideband LNA. The same problems exist in other multi-way switches, such as xPST and xPyT switch configurations.

Accordingly, there is a need for a multi-way signal switch design having reduced parasitic capacitance. The present invention addresses this need.

SUMMARY

The present invention encompasses a multi-way signal switch design having reduced parasitic capacitance. In a first embodiment, instead of using one FET shunt-switch in a signal path switch cell, two or more series-coupled FET shunt-switches are coupled to at least one series through-switch. At least one of the FET shunt-switches is set to an OFF state during normal operation so as to function as a capacitor, while at least one other shunt-switch is set to behave like a capacitor when the switch cell is in an ON state, and is set to behave like a resistor when the switch cell is in an OFF state. In a second embodiment, instead of using one FET shunt-switch in a signal path switch cell, the combination of at least one FET switch coupled in series with at least one capacitor functions as a shunt connection for the switch cell, wherein at least one FET shunt-switch is set to behave like a capacitor when the switch cell is in an ON state, and is set to behave like a resistor when the switch cell is in an OFF state.

One embodiment includes a switch cell including a first through-switch; a second through-switch coupled in series with the first through-switch; a capacitor; and a shunt-switch coupled in series with the capacitor, wherein the shunt-switch and the capacitor are coupled from a node between the first and second through-switches to a reference potential; wherein the shunt-switch is set to behave like a capacitor when the switch cell is in an ON state, and is set to behave like a resistor when the switch cell is in an OFF state.

The invention also encompasses methods for reducing parasitic capacitance in a signal switch cell. One such method includes coupling a first through-switch and a second through-switch in series; coupling a capacitor and a shunt-switch in series from a node between the first and second through-switches to a reference potential; and setting the shunt-switch to behave like a capacitor when the signal switch cell is in an ON state, and to behave like a resistor when the signal switch cell is in an OFF state.

A further aspect of the invention includes an RF receiver front-end including a low noise amplifier (LNA) configured to receive and amplify an RF signal, and a multi-way signal switch in accordance with the present invention. Yet another aspect of the invention includes a substrate including a plurality of interconnected integrated circuits, at least one interconnected integrated circuit including a multi-way signal switch in accordance with the present invention.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 4 is an equivalent circuit of a multiple-shunt switch circuit like the circuit shown in FIG. 3, but with tandem operation of the shunt-switches.

FIG. 5 is an equivalent circuit of a multiple-shunt switch circuit like the circuit shown in FIG. 3A, but with split operation of the shunt-switches.

FIG. 6 is a graph showing total equivalent capacitance $C_{EQ}$ as a function of the value of equivalent capacitor C2 for one modeled instance of the multiple-shunt switch circuit of FIG. 5.

Like reference numbers and designations in the various drawings indicate like elements.

DETAILED DESCRIPTION

The present invention encompasses a multi-way signal switch design having reduced parasitic capacitance. In a first embodiment, instead of using one FET shunt-switch in a signal path switch cell, two or more series-coupled FET shunt-switches are coupled to at least one series through-switch. At least one of the FET shunt-switches is set to an OFF state during normal operation so as to function as a capacitor, while at least one other shunt-switch is set to behave like a capacitor when the switch cell is in an ON state, and is set to behave like a resistor when the switch cell is in an OFF state. In a second embodiment, instead of using one FET shunt-switch in a signal path switch cell, the combination of at least one FET switch coupled in series with at least one capacitor functions as a shunt connection for the switch cell, wherein at least one FET shunt-switch is set to behave like a capacitor when the switch cell is in an ON state, and is set to behave like a resistor when the switch cell is in an OFF state.

First Embodiment

Figure 3A:
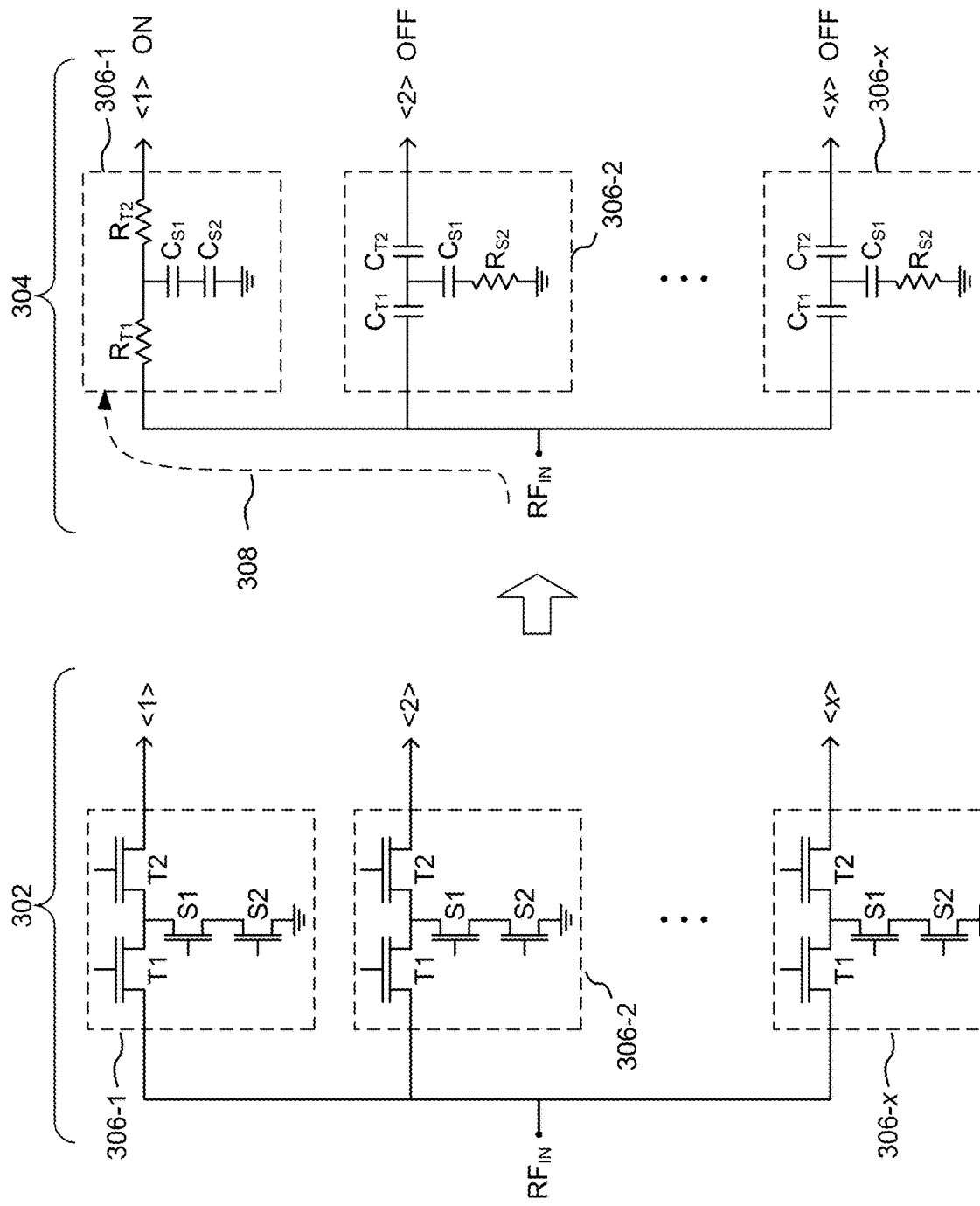
FIG. 3A is a diagram of one embodiment of an SPxT switch in accordance with the present invention, shown as a schematic diagram and as a corresponding equivalent circuit when one signal path is selected to be ON and all other signal paths are set to OFF.

FIG. 3A is a diagram of one embodiment of an SPxT switch in accordance with the present invention, shown as a schematic diagram 302 and as a corresponding equivalent circuit 304 when one signal path is selected to be ON and all other signal paths are set to OFF. In the schematic diagram 302, each of x signal paths <1> . . . <x> includes a switch cell 306-1 . . . 306-x that includes a first FET through-switch T1 coupled in series with a second FET through-switch T2. In alternative embodiments, only FET through-switch T1 or T2 may be used in a signal path.

Each switch cell 306-1 . . . 306-x also includes a shunt leg coupled to one or both FET through-switches T1, T2. In the illustrated example, the shunt leg comprises a first FET shunt-switch S1 coupled to a node between through-switches T1 and T2, and a second FET shunt-switch S2 coupled in series from the first FET shunt-switch S1 to a reference potential, such as circuit ground. As described in greater detail below, a shunt leg may include more than two FET shunt-switches coupled in series.

Figure 1:
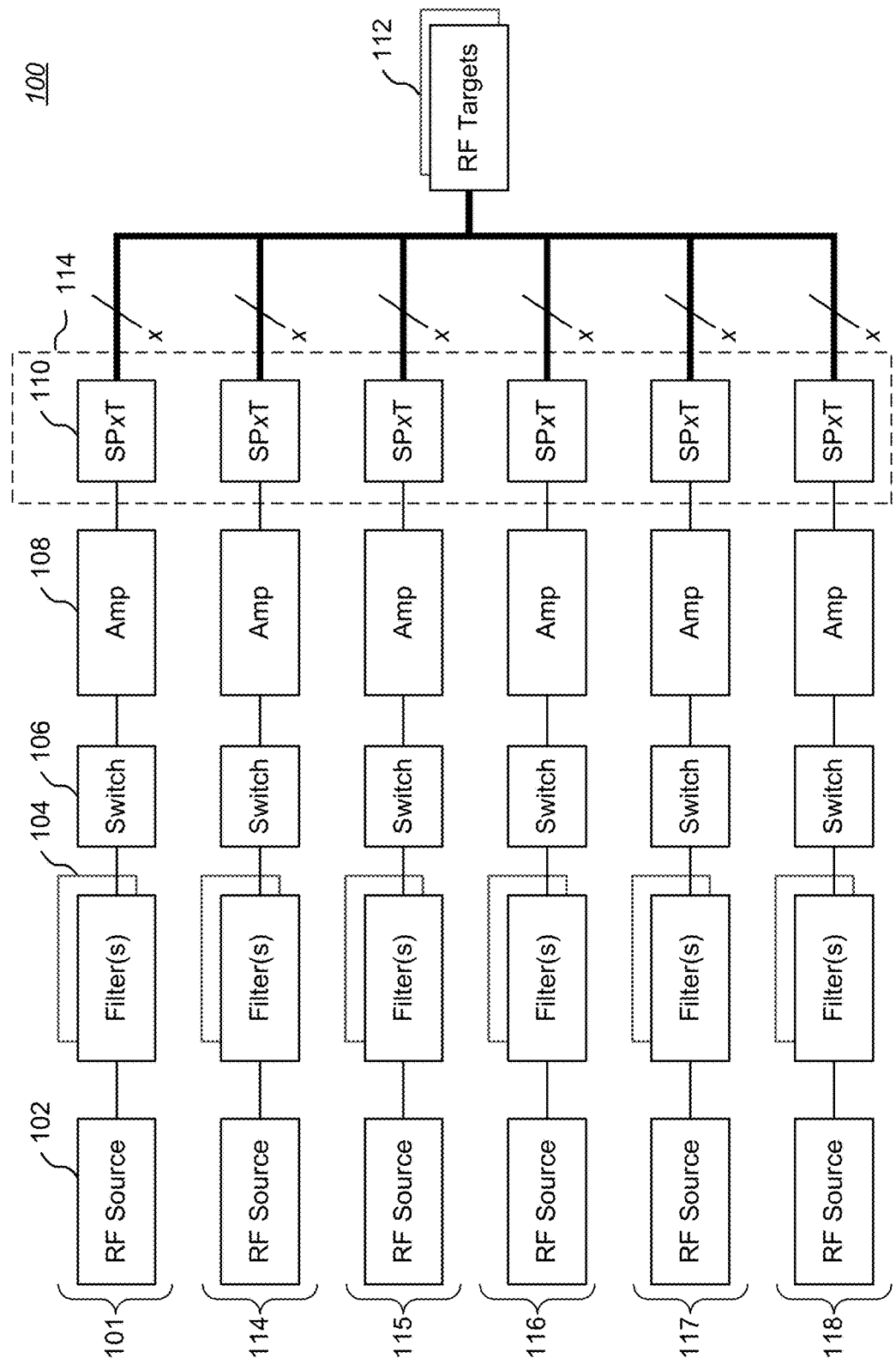
FIG. 1 is a block diagram of a prior art receiver-side front-end of an RF transceiver.
Figure 2:
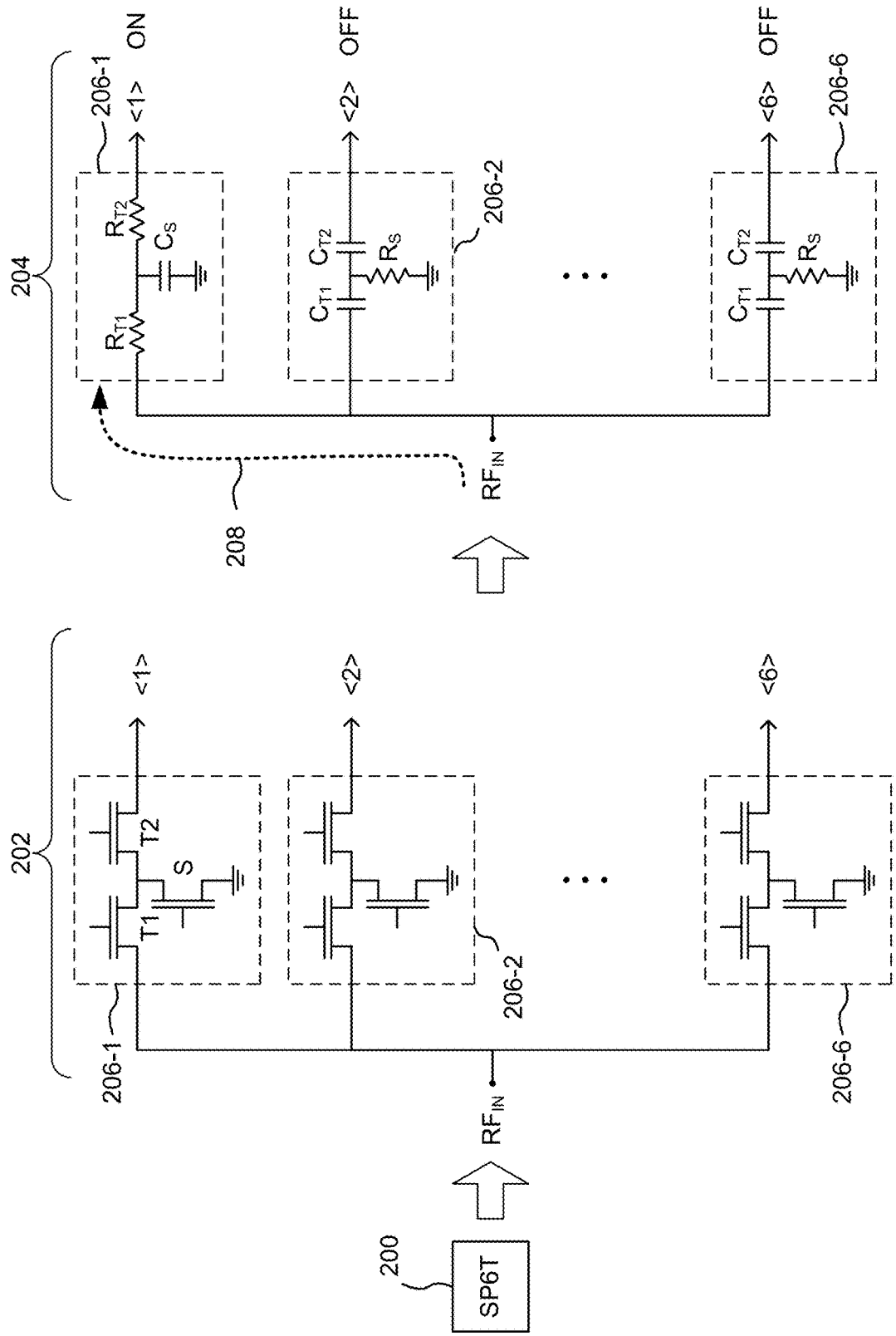
FIG. 2 is a diagram of a prior art SP6T switch shown in symbolic form, as a schematic diagram, and as a corresponding equivalent circuit when one signal path is selected to be ON and all other signal paths are set to OFF.

In the equivalent circuit 304, switch cell 306-1 is set to an ON state, allowing signals to propagate from $RF_{IN}$ along the pathway indicated by dotted line 308 to signal path <1> (thus, the signal path <1> may be considered to be in an ON state). All other switch cells 306-2 . . . 306-6 are set to an OFF state. For a signal path in the ON state, FET through-switches T1 and T2 of the corresponding switch cell behave like equivalent resistors $R_{T1}$ and $R_{T2}$. The first or second FET shunt-switches S1, S2 are in an OFF state and thus behave like respective capacitors $C_{S1}$ and $C_{S2}$. The values of the capacitances $C_{S1}$ and $C_{S2}$ may be selected such that the total series capacitance is about the same as the single capacitor of the switch shown in FIG. 2. However, the values of the capacitances $C_{S1}$ and $C_{S2}$ may be the same or different. Note also that the FET switches in the different signal paths 306-1 . . . 306-x need not be identical in terms of current carrying capacity or other electrical parameters.

For a signal path in the OFF state, FET through-switches T1 and T2 of the corresponding switch cell behave like equivalent capacitors $C_{T1}$ and $C_{T2}$. However, one of the first or second FET shunt-switches S1, S2 is forced to an OFF state during normal operation so as to behave like a capacitor, while the other of the first or second FET shunt-switches S1, S2 is set to an ON state so as to behave like a resistor. While the behavior for S1 and S2 is essentially order-independent, in the illustrated example, the first FET shunt-switch S1 is forced to an OFF state during normal operation so as to behave like a capacitor $C_{S1}$, and the second FET shunt-switch S2 is set to an ON state so as to behave like a resistor $R_{S2}$. In an alternative embodiment, the second FET shunt-switch S2 is forced to an OFF state during normal operation so as to behave like a capacitor $C_{S2}$, and the first FET shunt-switch S1 is set to an ON state so as to behave like a resistor $R_{S1}$. It is preferable (but not necessary) that the capacitance of the FET shunt-switch selected to behave like a capacitor should be approximately the same in each signal path 306-x.

The significance of including a capacitor element in the shunt leg of each switch cell 306-1 . . . 306-x is that while the function of each ON-state switch cell 306-1 . . . 306-x remains unaffected by the presence of the added FET shunt-switch, the equivalent capacitance $C_{EQ}$ of each OFF-state switch cell 306-1 . . . 306-x is reduced and accordingly the total equivalent capacitance at the RFin port is reduced.

Figure 3B:
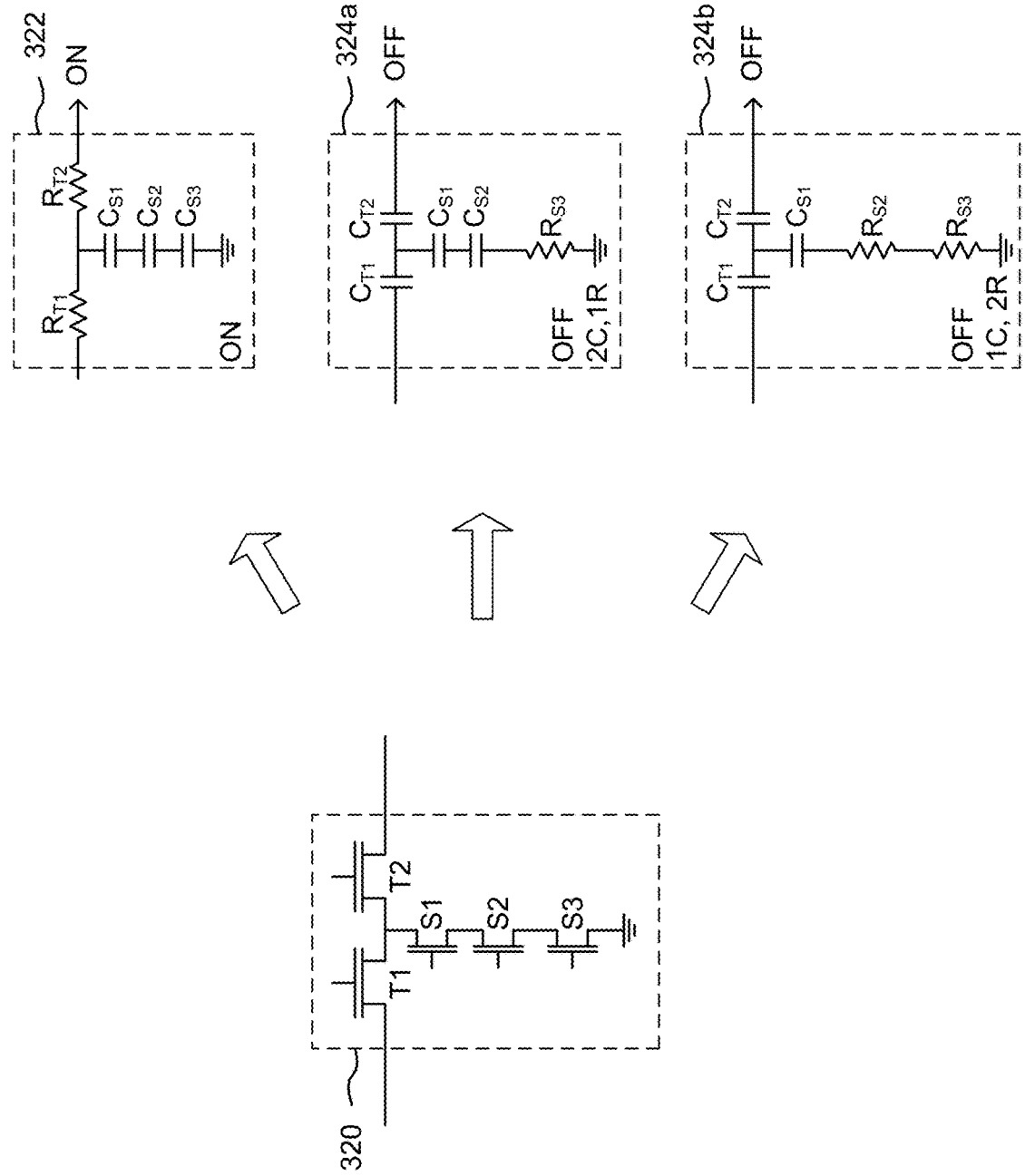
FIG. 3B is a schematic diagram of one embodiment of a signal path switch cell having more than two FETs per shunt leg, and a corresponding first equivalent circuit when the switch cell is ON and two alternative corresponding second equivalent circuits when the switch cell is OFF.

While FIG. 3A depicts an SPxT switch, the same shunt leg architecture of the present invention applies to other multi-way switches, such as xPST and xPyT configurations. In alternative embodiments, two or more FET shunt-switches may be used per shunt leg, with fixed or programmable setting of at least one FET shunt-switch to behave as a capacitor during normal operation, and with fixed or programmable setting of at least one FET shunt-switch to behave as a resistor when a signal path <1> . . . <x> is in OFF state and as a capacitor when a signal path <1> . . . <x> is in ON state. For example, FIG. 3B is a schematic diagram of one embodiment of a signal path switch cell 320 having more than two FETs per shunt leg, and a corresponding first equivalent circuit 322 when the switch cell is ON and two alternative corresponding second equivalent circuits 324a, 324b when the switch cell is OFF. In the illustrated example, the shunt leg of the switch cell 320 includes three FET shunt-switches S1-S3. The first equivalent circuit 322 shows the switch cell in an ON state, with the FET shunt-switches S1-S3 all set to OFF states, thus behaving like capacitors. When the switch cell 320 is set to an OFF state, there are additional degrees of design freedom because of the increased number of FET shunt-switches in the shunt leg. For example, in one option, shown in the dotted box labeled "2C, 1R", two of the three shunt leg FETs (e.g., FETS S1, S2) are set to an OFF state and behave like respective capacitors ($C_{S1}$ and $C_{S2}$ in this example), while the third shunt leg FET (e.g., FET S3) is set to an ON state and behaves like a resistor (e.g., $R_{S3}$). In a second option, shown in the dotted box labeled "1C, 2R", one shunt leg FET (e.g., FET S1) is set to an OFF state and behaves like a capacitor ($C_{S1}$ in this example), while the other two shunt leg FETs (e.g., FETS S2, S3) are set to an ON state and behave like resistors (e.g., $R_{S2}$, $R_{S3}$). As should be clear, the shunt legs may include more than three FET shunt-switches, enabling even more combinations of capacitors and resistors. More equivalent capacitors may be used if isolation is a priority, and more equivalent resistors may be used if lowering signal path equivalent capacitance is a priority.

Figure 3C:
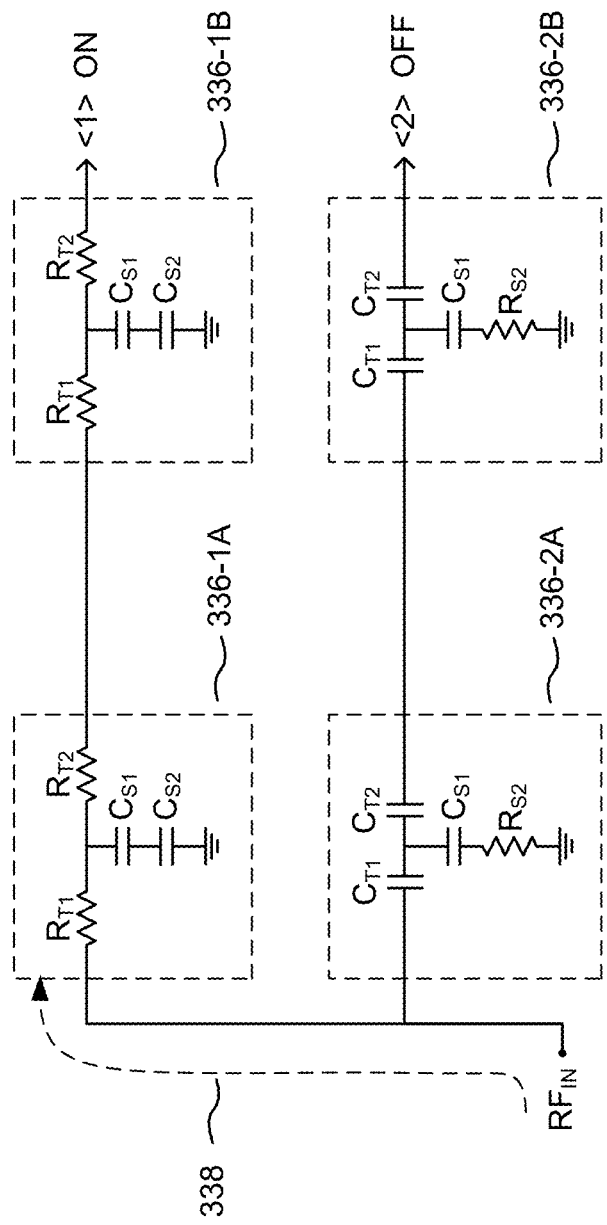
FIG. 3C is a diagram of an SP2T switch embodiment, shown as an equivalent circuit, having multiple switch cells per signal path.

In some embodiments, more than one set of signal path switches may be used between input and output ports. For example, FIG. 3C is a diagram of an SP2T switch embodiment, shown as an equivalent circuit, having multiple series-shunt switch cells 336-xA, 336-xB per signal path <1>, <2>. As should be clear, the corresponding schematic diagram can be readily worked out from the equivalent circuit. Note that adjacent switch cells (e.g., 336-1A, 336-1B) have adjacent equivalent resistors (e.g., $R_{T2}$ in switch cell 336-1A and $R_{T1}$ in switch cell 336-1B) corresponding to adjacent through-switch FETs, and accordingly may be replaced by a single FET device.

As noted above with respect to FIG. 3A, in normal split-shunt operation, one of the first or second FET shunt-switches S1, S2 is forced to an OFF state so as to behave like a capacitor for both ON and OFF states of a switch cell 306-1 . . . 306-x. However, the embodiment of FIG. 3A may also be operated in a conventional mode, with both the first and second FET shunt-switches S1, S2 switched in tandem to behave like resistors when a switch cell 306-1 . . . 306-x is in an OFF state, and to behave like capacitors when a switch cell 306-1 . . . 306-x is in an ON state. This characteristic allows one part (e.g., an IC) to be used in multiple modes of operation. This characteristic also makes it easy to compare conventional operation with the multiple-shunt operation of embodiments of the present invention in terms of calculated and measured (via simulation, for example) total equivalent capacitance $C_{EQ}$ of the signal paths <1> . . . <x> for an SPxT switch.

For example, FIG. 4 is an equivalent circuit of a multiple-shunt switch circuit 400 like the circuit shown in FIG. 3A, but with tandem operation of the shunt-switches. Accordingly, the multiple-shunt switch circuit 400 operates like a prior art SPxT switch when one signal path is selected to be ON and all other signal paths are set to be OFF. Each signal path switch cell 306-1 . . . 306-x is shown coupled to a 50 ohm load, Ro. In the OFF-state switch cells, the first and second FET shunt-switches S1, S2 are both set to an ON state so as to both behave like resistors. Assume approximate values for the equivalent resistances and capacitances are as set for the in TABLE 1:

TABLE 1

| Component | ~Value |
| --- | --- |
| C1 | 54 fF |
| C2 | 132 fF |
| C3 | 64 fF |
| R1 | 1.6 ohm |
| R2 | 1.4 ohm |
| R3 | 1.4 ohm |

Under the value assumptions set forth in TABLE 1 above, the approximated total equivalent capacitance $C_{EQ}$ of the signal paths <1> . . . <x> for an SP6T switch (i.e., x=6) like the example circuit in FIG. 4 is:

$$C_{EQ} = \frac{C2}{2} + ([x-1] * C1) = 336 fF \qquad \text{EQ. 1}$$

Under the same value assumptions, the approximated total equivalent capacitance $C_{EQ}$ of the signal paths <1> . . . <x> for an SP2T switch (i.e., x=2) is 120 fF. These results assume that the impedance of the C3 capacitor is much greater than R2 at the frequency of operation, and that Ro is much greater than R2 by design.

In contrast, FIG. 5 is an equivalent circuit of a multiple-shunt switch circuit 500 like the circuit shown in FIG. 3A, but with split operation of the shunt-switches. That is, the multiple-shunt switch circuit 500 operates with split-shunt switch functionality when one signal path is selected to be ON and all other signal paths are set to be OFF. Each signal path switch cell 306-1 . . . 306-x is shown coupled to a 50 ohm load, Ro. In the illustrated example, in each OFF-state switch cell, FET shunt-switch S1 is forced to an OFF state during normal operation so as to behave like a capacitor (C2), while FET shunt-switch S2 is set to an ON state so as to behave like a resistor (R2). Under the value assumptions set forth in TABLE 1 above, the approximated total equivalent capacitance $C_{EQ}$ of the switch cells <1> . . . <x> for an SP6T switch (i.e., x=6) like the example circuit in FIG. 5 is:

$$C_{EQ} = \frac{C2}{2} + ([x-1] * \{C1 \| [C2 + C3]\}) = 278 fF \qquad \text{EQ. 2}$$

Under the same value assumptions, the approximated total equivalent capacitance $C_{EQ}$ of the signal paths 306-x for an SP2T switch (i.e., x=2) is 108 fF. These results assume that the impedance of the C3 capacitor is much greater than Ro at the frequency of operation, and that the impedance of the C2 capacitor is much greater than R2 by design.

It will be noted that the reduction in total equivalent capacitance $C_{EQ}$ for the multiple-shunt switch circuit 500 of FIG. 5 compared to the multiple-shunt switch circuit 400 of FIG. 4 (when operated like a conventional switch) is attributable to the C2 and C3 values in parallel with C1. In contrast, in the multiple-shunt switch circuit 400 of FIG. 4, setting both the first and second FET shunt-switches S1, S2 to ON states so as to behave like resistors effectively removes C2 and bypasses C3, literally taking them out of the equation when computing $C_{EQ}$.

The value of equivalent capacitor C2 (i.e., one of the FET shunt-switches S1 or S2 in the forced OFF state) may be optimized to improve the total equivalent capacitance $C_{EQ}$ for the multiple-shunt switch circuit 500 of FIG. 5. For example, FIG. 6 is a graph 600 showing total equivalent capacitance $C_{EQ}$ as a function of the value of equivalent capacitor C2 for one modeled instance of the multiple-shunt switch circuit 500 of FIG. 5. As graph line 602 shows, at lower values of C2, $C_{EQ}$ improves relatively rapidly as C2 increases, but $C_{EQ}$ starts to level off as C2 reaches the higher end of the graphed range. While there is a noticeable dependence of $C_{EQ}$ on the C2 value, other tests have shown that there is very little dependence of $C_{EQ}$ on the value of equivalent resistor R2 in each signal path 306-x.

Example Results for First Embodiment

TABLE 2 sets forth a summary of the reduction in total equivalent capacitance $C_{EQ}$ in SP2T and SP6T designs in accordance with the present invention compared to conventional switch designs. Both the computed values described above and values derived using a circuit simulator are presented.

TABLE 2

| Switch Size | Computation Method | FIG. 4 $C_{EQ}$ fF (old design) | FIG. 5 $C_{EQ}$ fF (new design) | % improvement over old design |
| --- | --- | --- | --- | --- |
| SP2T | Equation | 120 | 108 | 10% |
| SP2T | Simulation | 116 | 100 | 13% |
| SP6T | Equation | 336 | 278 | 17% |
| SP6T | Simulation | 332 | 253 | 23% |

One point to note about the results in TABLE 2 is that the simulated SP6T switch actually has a significantly lower total equivalent capacitance $C_{EQ}$ (by 25 fF) than the value determined by EQ. 1. This is believed to occur due to the approximations involved in the equations used; in the approximations, the contribution of the resistors (though small) are ignored.

A benefit of the multiple-shunt switch circuit shown in FIG. 3A is that, for constant FET size, the total equivalent capacitance $C_{EQ}$ is reduced compared to conventional designs as the number of throws increases. Thus, as shown in TABLE 2, in one simulation of an SP2T switch, a switch configuration like that shown in FIG. 5 had a 13% reduction in total equivalent capacitance $C_{EQ}$ compared to a switch configuration like that shown in FIG. 4, with the values of C1-C3 and R1-R3 being the same for the respective designs. Increasing the number of throws to an SP6T switch, a switch configuration like that shown in FIG. 5 had a 23% reduction in total equivalent capacitance $C_{EQ}$ compared to a switch configuration like that shown in FIG. 4, with the values of C1-C3 and R1-R3 being the same for the respective designs. A further reduction in comparative total equivalent capacitance $C_{EQ}$ is expected to occur as the number of throws in an SPxT switch increases. Similar results may be achieved with other multi-way switch configurations.

Another benefit of the multiple-shunt switch circuit shown in FIG. 3A is that, for the same type of multi-way switch, the total equivalent capacitance $C_{EQ}$ is further reduced compared to conventional designs as the size of the individual switches increases. Increasing FET size increases ESD resistance, lowers $R_{ON}$, but increases $C_{OFF}$. For example, in one simulation of an SP6T switch fabricated with FETs having a size (width) of 378 µm (5.00 µm finger width x 75 fingers), a switch configuration like that shown in FIG. 5 had a 28% reduction in total equivalent capacitance $C_{EQ}$ compared to a switch configuration like that shown in FIG. 4, with the values of C1-C3 and R1-R3 being the same for the respective designs. As another example, in one simulation of a SP6T switch fabricated with FETs having a size of 800 µm (10 µm finger width x 80 fingers), a switch configuration like that shown in FIG. 5 had a 46% reduction in total equivalent capacitance $C_{EQ}$ compared to a switch configuration like that shown in FIG. 4, with the values of C1-C3 and R1-R3 being the same for the respective designs. A further reduction in comparative total equivalent capacitance $C_{EQ}$ is expected to occur as the FET sizes in an SPxT switch increases.

Second Embodiment

Figure 7:
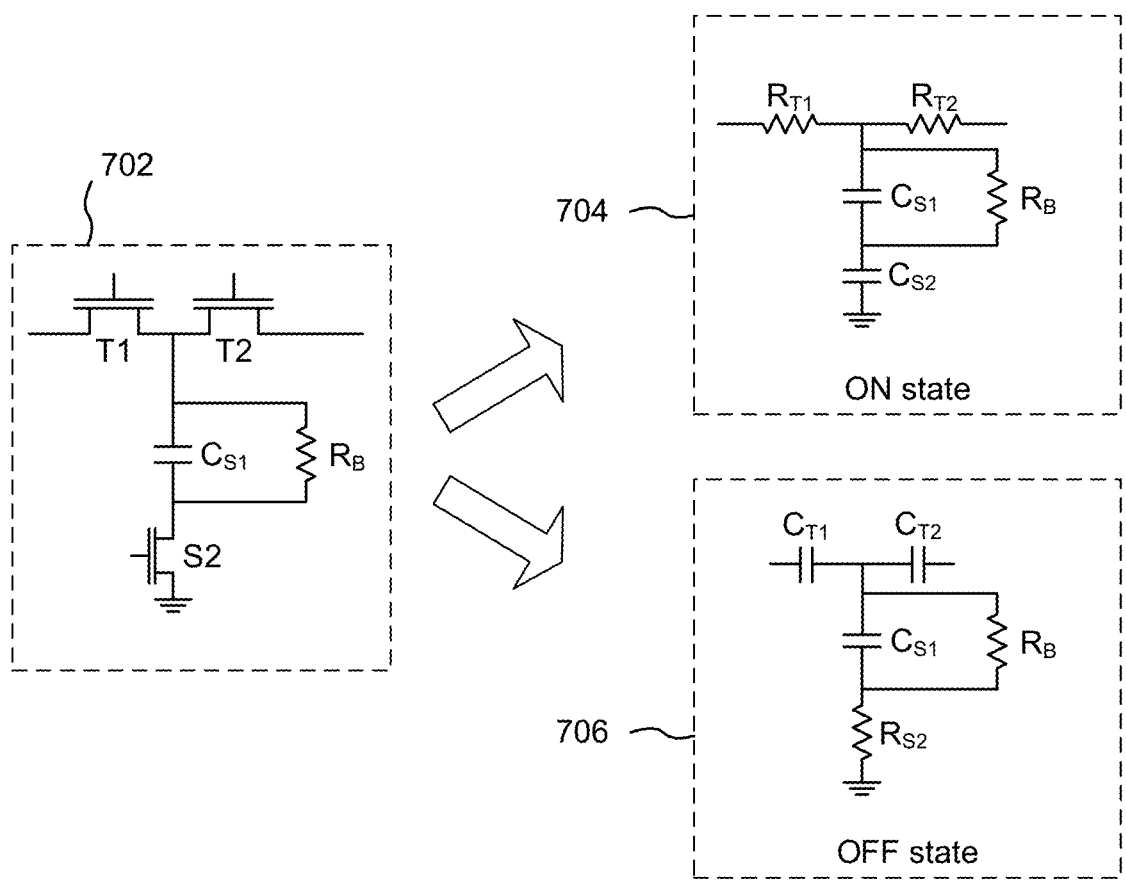
FIG. 7 is a diagram of one embodiment of a signal path switch cell for a multi-way switch in accordance with the present invention, shown as a schematic diagram, as a corresponding first equivalent circuit when the switch cell is ON, and as a corresponding second equivalent circuit when the switch cell is OFF.

FIG. 7 is a diagram of one embodiment of a signal path switch cell for a multi-way switch in accordance with the present invention, shown as a schematic diagram 702, as a corresponding first equivalent circuit 704 when the switch cell is ON, and as a corresponding second equivalent circuit 706 when the switch cell is OFF.

In contrast to conventional designs, instead of using one FET shunt-switch in a shunt leg, a FET shunt-switch S2 is coupled in series with a designed-in capacitor $C_{S1}$. A bias resistor $R_B$ is coupled in parallel with the capacitor $C_{S1}$ to provide a DC bias voltage to the FET shunt-switch S2; for that function, the bias resistor $R_B$ would typically have a value in the tens of thousands of ohms and thus have little effect on the capacitor $C_{S1}$. Note that the order of the FET shunt-switch S2 with respect to the capacitor $C_{S1}$ and bias resistor $R_B$ may be reversed.

In IC embodiments, the capacitor $C_{S1}$ may be implemented as a metal-oxide-metal (MOM) capacitor or as a metal-insulator-metal (MIM) capacitor. A MOM capacitor is generally constructed of multiple inter-digitated fingers, while a MIM capacitor generally consists of parallel plates formed by two metal planes separated by a thin dielectric. Fabrication of both types of capacitors is well known in the art.

The use of a designed-in capacitor $C_{S1}$ may result in less current leakage compared to a FET operated in an OFF state so as to behave like a capacitor. Further, the breakdown voltage of a designed-in capacitor is (usually) larger than a FET, allowing higher power applications. However, an all-FET solution like that shown in FIG. 3A may provide better ESD protection since a FET capacitor provides a path to a reference potential (e.g., circuit ground).

Switch Control

Each individual FET switch illustrated in the examples shown in FIGS. 3A-3C, 4, 5, and 7 includes an associated control line (not shown) that enables setting the switch to an ON (or CLOSED) conductive state or to an OFF (or OPEN) non-conductive or blocking state, and thus each FET behaves as a single-pole, single-throw (SPST) switch. In some embodiments, to withstand higher voltages, some or all of the illustrated FETs may be implemented as a stack of FETs controlled by a common control line signal so as to switch ON or OFF concurrently, and thus the stack of FETs behaves like a single SPST switch. Accordingly, while this disclosure provides examples showing a single FET switch symbol, in some embodiments, each symbolic FET switch may be implemented as a stack of commonly-controlled FETs.

Each FET control line would be coupled to other circuitry (not shown), which may be internal or external. For example, control signals may be provided to the switch control lines through the well-known interfaces specified by the MIPI (Mobile Industry Processor Interface) Alliance, or through the well-known Serial Peripheral Interface (SPI) bus, or by direct control signal pins, or by any other convenient means. Applied control signals may be directly coupled to associated FET switches or be processed through combinatorial logic circuitry or a mapping circuit (e.g., a lookup table) before being coupled to associated FET switches. In addition, the gate of each FET may be coupled to a driver circuit that converts a logic signal (1, 0) to a suitable drive voltage (e.g., +3V, −3V).

Benefits & System Aspects

Embodiments of the present invention provide a number of benefits in comparison to conventional designs, including reduced parasitic capacitance. Use in a receiver-side of an RF transceiver as a post-filter switch 106 and/or a SPxT post-amplifier switch 108 results in better system performance. The benefits of reduced parasitic capacitance in a multiple-shunt switch circuit are particular useful in improving LNA performance compared to a conventional switch design. Modeled multiple-shunt switch circuits have shown that they can substantially reduce parasitic capacitance while still meeting stringent isolation specifications (at least 30 dB) and having ample power handling capability for post-LNA switching needs.

Embodiments of the present invention are useful in a wide variety of larger radio frequency (RF) circuits and systems for performing a range of functions, including (but not limited to) radio systems (e.g., for personal computers, tablet computers, cellular telephones, and wireless network components), televisions, cable system "set top" boxes, radar systems (including phased array and automotive radar systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, WiFi (e.g., 802.11a, b, g, ac, ax), "personal" area networks (e.g., Bluetooth based systems), as well as other radio communication standards and protocols.

Figure 8:
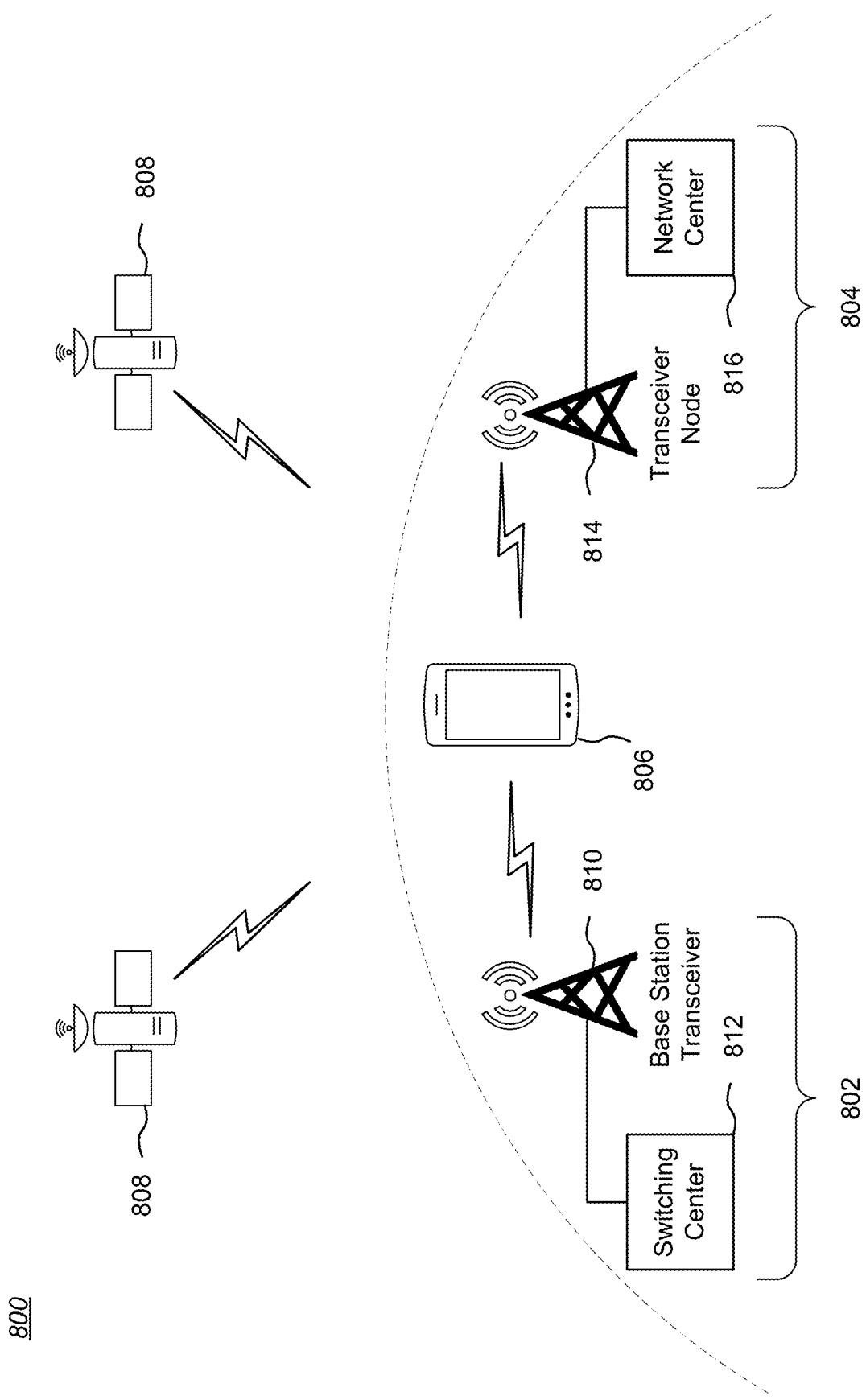
FIG. 8 illustrates an exemplary prior art wireless communication environment comprising different wireless communication systems, and which may include one or more mobile wireless devices.

As an example of wireless RF system usage, FIG. 8 illustrates an exemplary prior art wireless communication environment 800 comprising different wireless communication systems 802 and 804, and which may include one or more mobile wireless devices 806.

A wireless device 806 may be capable of communicating with multiple wireless communication systems 802, 804 using one or more of the telecommunication protocols noted above. A wireless device 806 also may be capable of communicating with one or more satellites 808, such as navigation satellites (e.g., GPS) and/or telecommunication satellites. The wireless device 806 may be equipped with multiple antennas, externally and/or internally, for operation on different frequencies and/or to provide diversity against deleterious path effects such as fading and multipath interference. A wireless device 806 may be a cellular phone, a personal digital assistant (PDA), a wireless-enabled computer or tablet, or some other wireless communication unit or device. A wireless device 806 may also be referred to as a mobile station, user equipment, an access terminal, or some other terminology.

The wireless system 802 may be, for example, a CDMA-based system that includes one or more base station transceivers (BSTs) 810 and at least one switching center (SC) 812. Each BST 810 provides over-the-air RF communication for wireless devices 806 within its coverage area. The SC 812 couples to one or more BSTs in the wireless system 802 and provides coordination and control for those BSTs.

The wireless system 804 may be, for example, a TDMA-based system that includes one or more transceiver nodes 814 and a network center (NC) 816. Each transceiver node 814 provides over-the-air RF communication for wireless devices 806 within its coverage area. The NC 816 couples to one or more transceiver nodes 814 in the wireless system 804 and provides coordination and control for those transceiver nodes 814.

In general, each BST 810 and transceiver node 814 is a fixed station that provides communication coverage for wireless devices 806, and may also be referred to as base stations or some other terminology. The SC 812 and the NC 816 are network entities that provide coordination and control for the base stations and may also be referred to by other terminologies.

Figure 9:
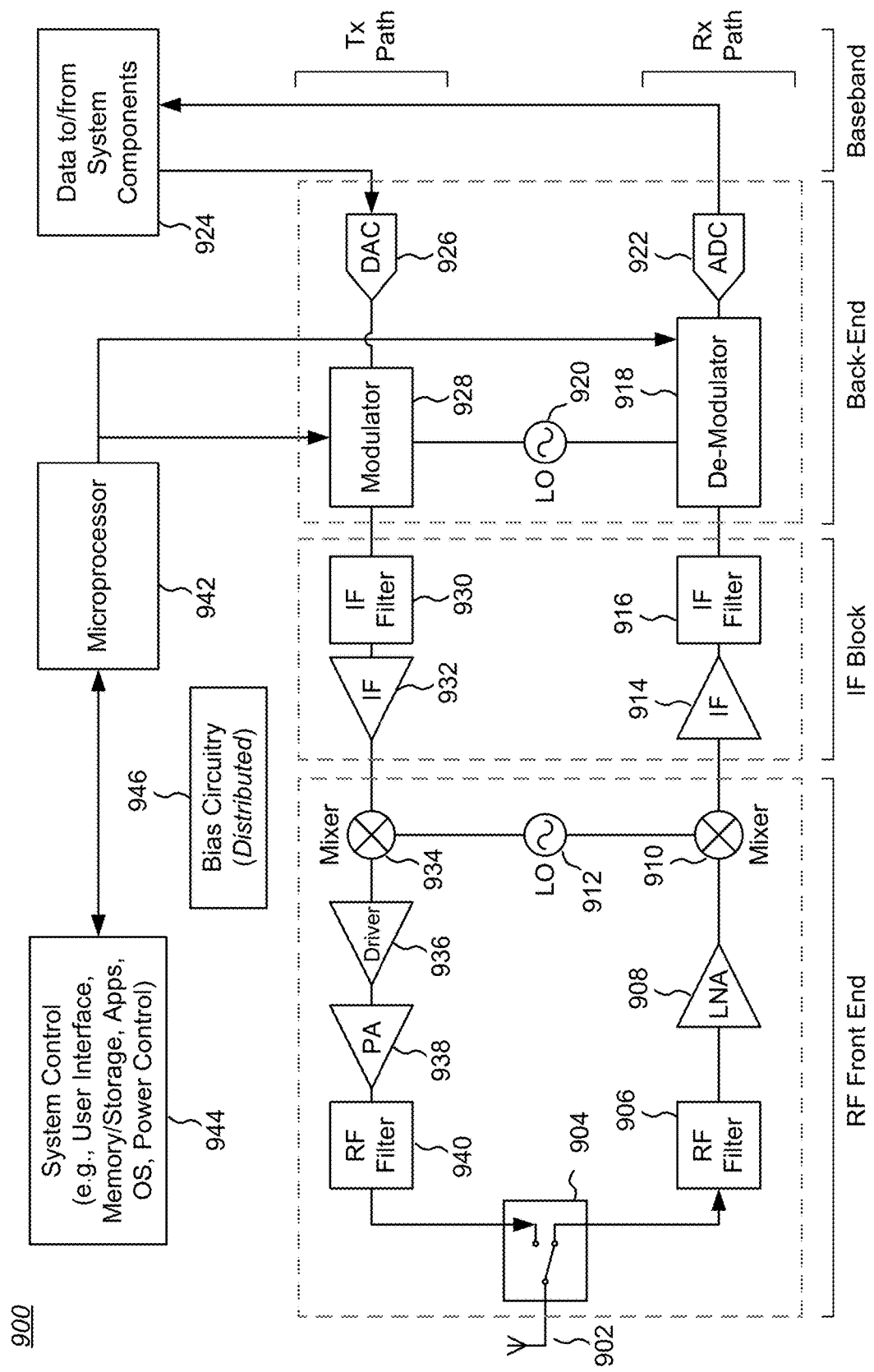
FIG. 9 is a block diagram of a transceiver that might be used in a wireless device, such as a cellular telephone, and which may beneficially incorporate an embodiment of the present invention for improved performance.

An important aspect of any wireless system, including the systems shown in FIG. 8, is in the details of how the component elements of the system perform. FIG. 9 is a block diagram of a transceiver 900 that might be used in a wireless device, such as a cellular telephone, and which may beneficially incorporate an embodiment of the present invention for improved performance. As illustrated, the transceiver 900 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 902 and a switching unit 904, which may be implemented with active switching devices (e.g., field effect transistors or FETs, including multi-way switch embodiments in accordance with the present invention), or with passive devices that implement frequency-domain multiplexing, such as a diplexer or duplexer. An RF filter 906 passes desired received RF signals to a low noise amplifier (LNA) 908, the output of which is combined in a mixer 910 with the output of a first local oscillator 912 to produce an intermediate frequency (IF) signal. As described above, more than one LNA 908 may be used, which may benefit from the use of multi-way switch embodiments in accordance with the present invention to route signals.

The IF signal may be amplified by an IF amplifier 914 and subjected to an IF filter 916 before being applied to a demodulator 918, which may be coupled to a second local oscillator 920. The demodulated output of the demodulator 918 is transformed to a digital signal by an analog-to-digital converter 922 and provided to one or more system components 924 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 924 is transformed to an analog signal by a digital-to-analog converter 926, the output of which is applied to a modulator 928, which also may be coupled to the second local oscillator 920. The modulated output of the modulator 928 may be subjected to an IF filter 930 before being amplified by an IF amplifier 932. The output of the IF amplifier 932 is then combined in a mixer 934 with the output of the first local oscillator 912 to produce an RF signal. The RF signal may be amplified by a driver 936, the output of which is applied to a power amplifier (PA) 938. The amplified RF signal may be coupled to an RF filter 940, the output of which is coupled to the antenna 902 through the switching unit 904.

The operation of the transceiver 900 is controlled by a microprocessor 942 in known fashion, which interacts with system control components (e.g., user interfaces, memory/storage devices, application programs, operating system software, power control, etc.). In addition, the transceiver 900 will generally include other circuitry, such as bias circuitry 946 (which may be distributed throughout the transceiver 900 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 900 may be in a positioned in a different order (e.g., filters) or omitted. Other components can be (and usually are) added (e.g., additional filters, impedance matching networks, variable phase shifters/attenuators, power dividers, etc.). For routing signals, instances of multi-way switch embodiments in accordance with the present invention may be used as needed or desired.

The current invention provides reduced parasitic capacitance without adding extra external/internal tuning components and thus improves the performance of certain circuit modules or blocks, particularly the performance of RF switches and LNAs. These system-level improvements are specifically enabled by the current invention since a number of RF standards and increasing stringent customer specifications require better RF switch and LNA performance. In order to comply with system standards or customer requirements, the current invention is therefore critical to the overall solution shown in FIG. 9. The current invention therefore specifically defines a system-level embodiment that is creatively enabled by its inclusion in that system.

Methods

Figure 10A:
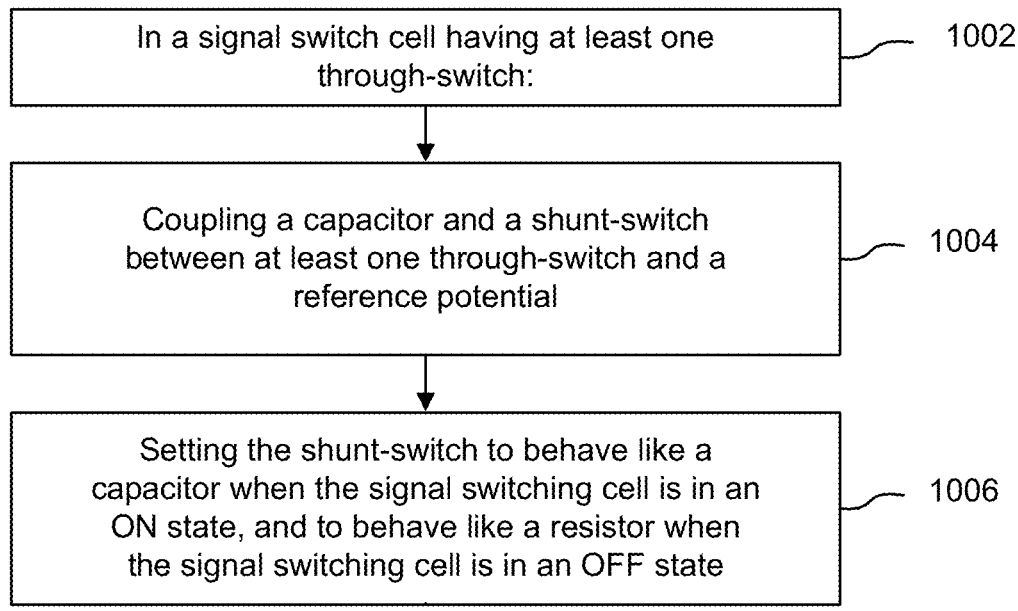
FIG. 10A is a process flow chart showing a first method for reducing parasitic capacitance in a signal switch cell.

Another aspect of the invention includes methods for reducing parasitic capacitance in a signal switch cell. For example, FIG. 10A is a process flow chart 1000 showing a first method for reducing parasitic capacitance in a signal switch cell having at least one through-switch (Block 1002). The method includes: coupling a capacitor and a shunt-switch in series from between at least one through-switch and a reference potential (Block 1004); and setting the shunt-switch to behave like a capacitor when the signal switch cell is in an ON state, and to behave like a resistor when the signal switch cell is in an OFF state (Block 1006).

Figure 10B:
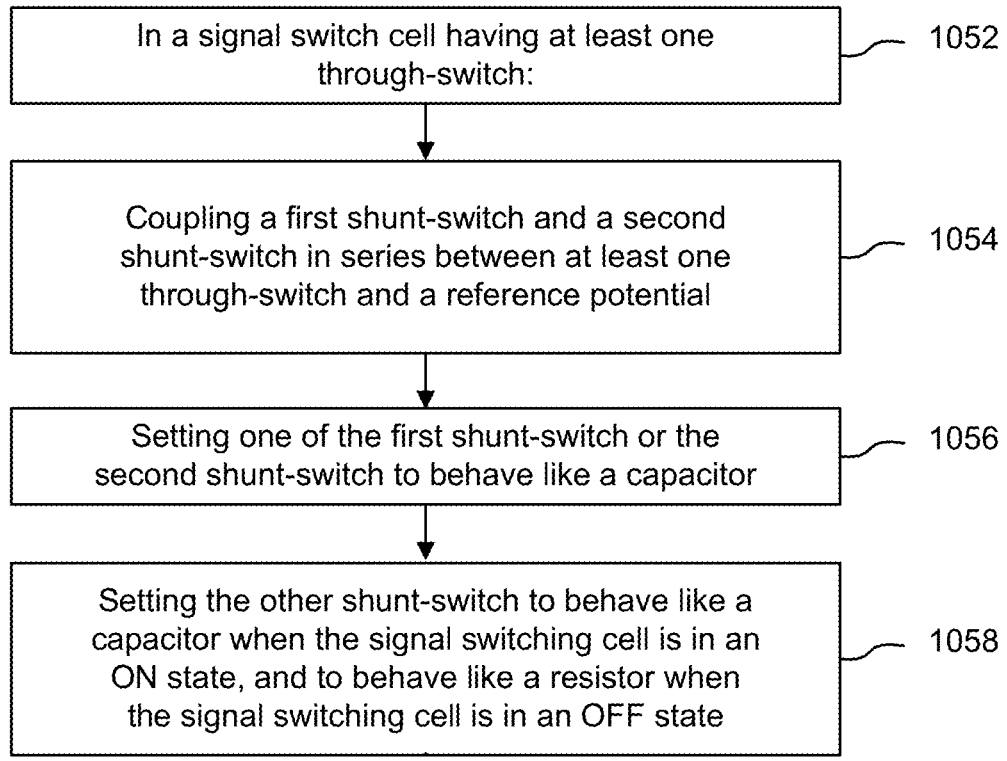
FIG. 10B is a process flow chart showing a second method for reducing parasitic capacitance in a signal switch cell.

As another example, FIG. 10B is a process flow chart 1050 showing a second method for reducing parasitic capacitance in a signal switch cell having at least one through-switch (Block 1052). The method includes: coupling a first shunt-switch and a second shunt-switch in series between at least one through-switch and a reference potential (Block 1054); setting one of the first shunt-switch or the second shunt-switch to behave like a capacitor (Block 1056); and setting the other of the first shunt-switch or the second shunt-switch to behave like a capacitor when the signal switch cell is in an ON state, and to behave like a resistor when the signal switch cell is in an OFF state (Block 1058).

Additional aspects of the above methods may include one or more of the following: wherein the capacitor includes a field-effect transistor set to a non-conducting state; wherein the capacitor includes a metal-oxide-metal capacitor; wherein the capacitor includes a metal-insulator-metal capacitor; wherein at least one switch is a field-effect transistor (FET); and/or wherein at least one FET is implemented as a stack of two or more FETs controlled by a common control line signal so as to switch ON or OFF concurrently.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies (such as bipolar, BiCMOS, LDMOS, BCD, GaAs HBT, GaN HEMT, GaAs pHEMT, and MESFET technologies) and other switch types (such as suitably biased PIN diodes) that can leverage a similar benefit using a switchable or fixed capacitor in the shunt leg of a switch cell. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 11:
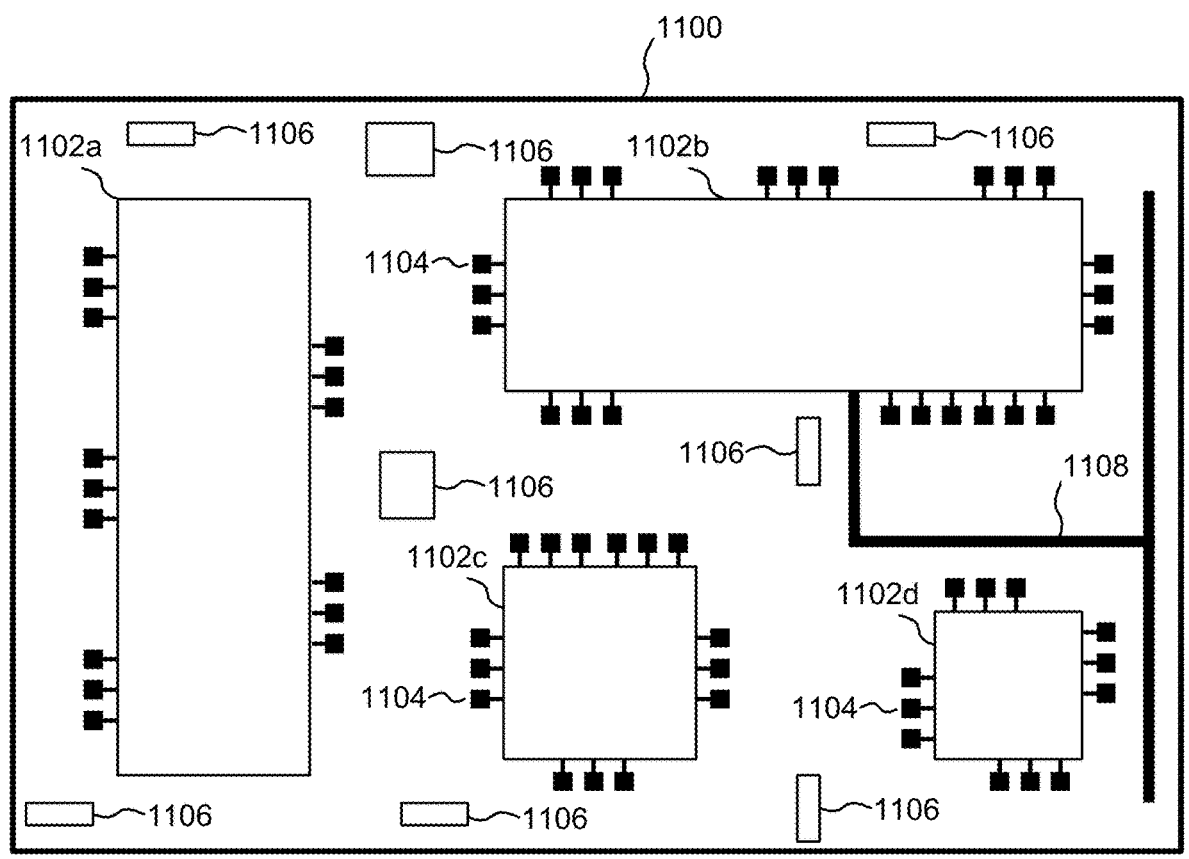
FIG. 11 is a top plan view of a chip module or printed circuit board.

As one example of further integration of embodiments of the present invention with other components, FIG. 11 is a top plan view of a substrate 1100 that may be, for example, a printed circuit board or chip module substrate (e.g., a thin-film tile). In the illustrated example, the substrate 1100 includes multiple ICs 1102a-1102d having terminal pads 1104 which would be interconnected by conductive vias and/or traces on and/or within the substrate 1100 or on the opposite (back) surface of the substrate 1100 (to avoid clutter, the surface conductive traces are not shown and not all terminal pads are labelled). The ICs 1102a-1102d may embody, for example, signal switches, active filters, amplifiers (including one or more LNAs) and other circuitry. For instance, IC 1102b may incorporate a multiple-shunt switch circuit like the circuit shown in FIG. 3A.

The substrate 1100 may also include one or more passive devices 1106 embedded in, formed on, and/or affixed to the substrate 1100. While shown as generic rectangles, the passive devices 1106 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 1100 to other passive devices 1106 and/or the individual ICs 1102a-1102d.

The front or back surface of the substrate 1100 may be used as a location for the formation of other structures. For example, one or more so-called patch antennae may be formed on or affixed to the front or back surface of the substrate 1100; one example of a front-surface patch antenna 1108 is shown, coupled to an IC die 1102b, which may include RF front-end circuitry. A patch antenna, and various known variations, is a type of radio antenna with a low profile which can be formed or mounted on a flat surface. Thus, by including one or more patch antennae on the substrate 1100, a complete radio may be created.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A switch cell including:
   (a) a first through-switch;
   (b) a second through-switch coupled in series with the first through-switch at a node;
   (c) a first shunt-switch; and
   (d) a second shunt-switch;
   wherein the first shunt-switch and the second shunt-switch are electrically coupled in series between the node and a reference potential, and each has independently controlled conducting and non-conducting states;
   wherein the node is coupled to the reference potential only through the first shunt-switch and the second shunt-switch;
   wherein one of the first shunt-switch or the second shunt-switch is set to its non-conducting state to behave like a capacitor; and
   wherein the other of the first shunt-switch or the second shunt-switch is set to its non-conducting state to behave like a capacitor when the switch cell is in an ON state, and is set to its conducting state to behave like a resistor when the switch cell is in an OFF state.

2. The invention of claim 1, wherein at least one of the first through-switch, the second through-switch, the first shunt-switch, and/or the second shunt-switch is a field-effect transistor (FET).

3. The invention of claim 1, wherein at least one of the first through-switch, the second through-switch, the first shunt-switch, and/or the second shunt-switch is implemented as a stack of two or more FETs controlled by a common control line signal so as to switch ON or OFF concurrently.

4. A multi-way signal switch including a number x of switch cells coupled in parallel and configured to selectively switch a received signal to at least one of x outputs, at least one switch cell including:
   (a) a first through-switch;
   (b) a second through-switch coupled in series with the first through-switch at a node;
   (c) a first shunt-switch; and
   (d) a second shunt-switch;
   wherein the first shunt-switch and the second shunt-switch are electrically coupled in series between the node and a reference potential, and each has independently controlled conducting and non-conducting states;
   wherein the node is coupled to the reference potential only through the first shunt-switch and the second shunt-switch;
   wherein one of the first shunt-switch or the second shunt-switch is set to its non-conducting state to behave like a capacitor; and
   wherein the other of the first shunt-switch or the second shunt-switch is set to its non-conducting state to behave like a capacitor when the switch cell is in an ON state, and is set to its conducting state to behave like a resistor when the switch cell is in an OFF state.

5. The invention of claim 4, wherein at least one of the first through-switch, the second through-switch, the first shunt-switch, and/or the second shunt-switch is a field-effect transistor (FET).

6. The invention of claim 4, wherein at least one of the first through-switch, the second through-switch, the first shunt-switch, and/or the second shunt-switch is implemented as a stack of two or more FETs controlled by a common control line signal so as to switch ON or OFF concurrently.

7. A switch cell including:
(a) a first through-switch;
(b) a second through-switch coupled in series with the first through-switch at a node;
(c) a first shunt-switch; and
(d) a second shunt-switch;
  wherein the first shunt-switch and the second shunt-switch are electrically coupled in series between the node and a reference potential, and each has independently controlled conducting and non-conducting states;
  wherein the node is coupled to the reference potential only through the first shunt-switch and the second shunt-switch;
  wherein in a first mode of operation, one of the first shunt-switch or the second shunt-switch is set to its non-conducting state to behave like a capacitor, and the other of the first shunt-switch or the second shunt-switch is set to its non-conducting state to behave like a capacitor when the switch cell is in an ON state, and is set to its conducting state to behave like a resistor when the switch cell is in an OFF state; and
  wherein in a second mode of operation, each of the first shunt-switch and the second shunt-switch is set to its non-conducting state to behave like a capacitor when the switch cell is in an ON state, and is set to its conducting state to behave like a resistor when the switch cell is in an OFF state.

8. The invention of claim 7, wherein at least one of the first through-switch, the second through-switch, the first shunt-switch, and/or the second shunt-switch is a field-effect transistor (FET).

9. The invention of claim 7, wherein at least one of the first through-switch, the second through-switch, the first shunt-switch, and/or the second shunt-switch is implemented as a stack of two or more FETs controlled by a common control line signal so as to switch ON or OFF concurrently.

* * * * *